United States Patent
Loman et al.

(10) Patent No.: US 6,643,592 B1
(45) Date of Patent: Nov. 4, 2003

(54) SYSTEM AND METHOD FOR FAULT DIAGNOSIS

(75) Inventors: James Mark Loman, Saratoga Springs, NY (US); Kelvin Ma, Clifton Park, NY (US); David Wayne Riffel, Pewaukee, WI (US)

(73) Assignee: General Electric Company, Niskayuna, NY (US)

( * ) Notice: Subject to any disclaimer, the term of this patent is extended or adjusted under 35 U.S.C. 154(b) by 144 days.

(21) Appl. No.: 09/617,970

(22) Filed: Oct. 5, 2000

(51) Int. Cl.[7] .............................................. G01N 23/083
(52) U.S. Cl. ........................................... 702/35; 702/84
(58) Field of Search .............................. 702/35, 84, 81; 340/945, 267; 364/468; 112/121; 714/26; 700/110, 109, 171, 159; 709/203, 315

(56) References Cited

U.S. PATENT DOCUMENTS 4,788,531 A * 11/1988 Corwin et al. .............. 340/945
5,127,005 A * 6/1992 Oda et al. ..................... 714/26
5,216,612 A * 6/1993 Cornett et al. ................ 700/96

* cited by examiner

*Primary Examiner*—John Barlow
*Assistant Examiner*—Tung S Lau
(74) *Attorney, Agent, or Firm*—Ann M. Agosti; Patrick K. Patnode

(57) ABSTRACT

A method and system for accessing a remote site by a field engineer faced with a machine fault. The remote site includes various expert systems and fault prediction tools to assist the field engineer. In the event the field engineer is unable to diagnose the fault and repair the machine the machine is returned to a repair center, accompanied by an automatically generated return code that identifies the various analysis conducted by the field engineer and the potential fault causes identified during that analysis process.

16 Claims, 4 Drawing Sheets

SYSTEM AND METHOD FOR FAULT DIAGNOSIS

BACKGROUND OF THE INVENTION

The invention relates to a method and system for diagnosing and repairing operational faults on a machine, and more specifically to accessing remotely located information to assist with the diagnosis and repair.

The diagnosis, maintenance and repair of a complex system used in industrial processes, medical imaging, telecommunications, aerospace applications, transportation, and power generation involves extremely complex and time consuming processes. Efficient and cost-effective operation of the machine requires fast and accurate diagnosis of machine faults, followed by a repair to return the machine to operational status.

The conventional diagnosis and repair process for most machines is based on the experience of the field engineer, in conjunction with the use of paper-based service information describing the components and operation of the machine. In some situations, a performance log may be available as an aid to the diagnostic process. Such performance logs can be created manually by the machine users or generated automatically by the machine itself. After examining the symptoms displayed by the machine and entries in the performance log, the field engineer uses his accumulated experience and training to map incidents occurring within the machine to one or more potential faults that may be causing these incidents. For simple problems with simple machines, this process works well. However, if the problem is complex and the root cause difficult to discern, the experienced field engineer may be unable to identify the problem. In that case, the machine is rendered out of service and the machine or at least a suspect part of the machine is returned to a repair center for further analysis and repair or replacement. The inability of the field engineer to accomplish the repair on-site creates a cost for the machine owner while the faulty machine is out of service during the pendency of the repair.

Some complex machines incorporate diagnostic processes and sensors that can automatically report faults and machine operational parameters. Typically, to diagnose a fault in such a machine, a field engineer studies the fault log and the operational parameters as an aid to determining the root cause of the fault. Although the fault log can provide helpful diagnosis information, the field engineer also relies substantially on her prior experiences with the machine (or similar machines) to make a full and complete diagnosis and successful repair.

To perform the diagnosis and repair, the field engineer uses service documentation, including block diagrams, exploded diagrams, parts lists, assembly drawings, schematics, etc. The documentation may be applicable only to a specific machine model number; it usually will not be unique to the specific machine undergoing diagnosis and repair. Obviously, as the complexity of the machine increases, the amount of paper needed to describe the machine and assist with the diagnosis and repair process likewise increases. Again, the field engineer relies on his experiences with the machine, and others like it, in conjunction with the paper-based information, to perform the diagnosis and subsequent repair.

Yet another problem with a paper-based system as applied to complex machines, is the variety of machine configurations, with each having its own unique service documentation. During the production run of a given model, there may be multiple redesigns and changes. Thus, the paper-based service documentation, which is usually based on a specific model number, may not accurately reflect the technical content of a specific machine bearing that model number. When the problems associated with model run changes are considered in light of a paper-based system, there is presented an inordinately complex and unmanageable problem of locating the correct service documentation for a specific machine.

In addition to the standard service documentation, it would also be desirable for the field engineer to have access to design information created during the design of the machine by the design engineering personnel. Such detailed information may help the field engineer understand the interrelationship of various machine components. Failure mode and effects analysis and fault tree documentation can also advantageously aid the field engineer in correctly diagnosing the machine fault. Unfortunately, frequently the repair activity is undertaken without detailed knowledge of the system design and the system design is undertaken with little input from field engineers having responsibility to repair the machine.

One problem that has been noted with field service repairs is the tendency of the field engineer to fix problems with which they are familiar, rather than undertaking a complete and thorough analysis to identify the root cause of the problem and fix it. For example, a field engineer may be familiar with an air conditioner problem typically caused by a faulty switch. Unknown to the field engineer, engineering personnel may have redesigned the switch so that it is now much less likely to be the culprit when a given fault occurs. However, the field engineer, being unaware of the redesign, will continue to replace the switch whenever he encounters a fault which had previously been resolved by replacing the switch. The result will be a failed repair.

SUMMARY OF INVENTION

Briefly, in accordance with one embodiment of the present invention, a method for analyzing a fault condition on a machine comprises: receiving fault symptoms to provide a fault analysis; automatically attempting to determine a probable cause of the fault; if a probable fault cause is determined, automatically generating an indication of the fault cause; and, if a probable fault cause is not determined, automatically generating a return code associated with the fault symptoms and the fault analysis.

In accordance with another embodiment of the invention, a method for use by a field engineer for analyzing a fault condition on a machine located at a machine site comprises: at the machine site, providing information to an analysis tool for analyzing the fault, wherein the information is provided by the field engineer as queried by the analysis tool, and wherein a plurality of individual queries and field engineer responses constitute a search path; if the analysis tool determines the probable cause of the fault, repairing the machine at the machine site based thereon; and, if the analysis tool is unable to determine the probable cause of the fault, assigning a return code prior to moving at least a part of the machine to a repair center, wherein the search path is associated with the return code.

BRIEF DESCRIPTION OF DRAWINGS

The features and advantages of the present invention will become apparent from the following detailed description of the invention when read together with the accompanying drawings in which.

DETAILED DESCRIPTION

Figure 1:
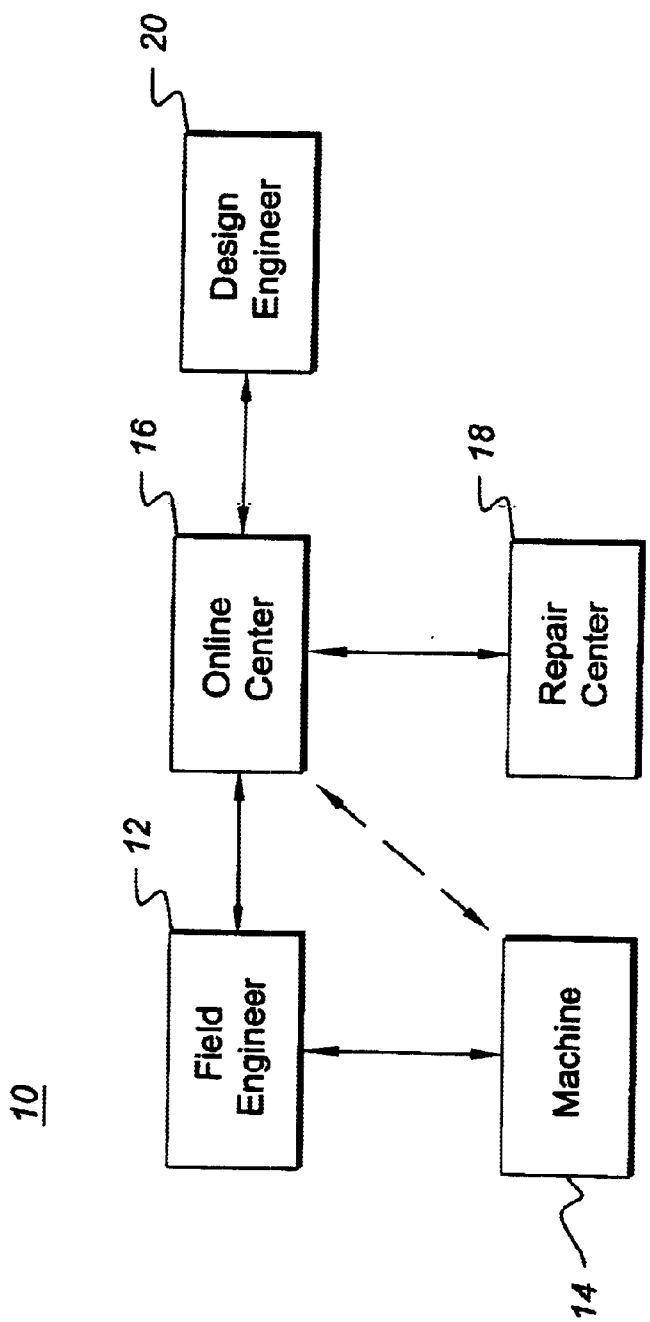
FIG. 1 is a block diagram showing the elements of a system constructed according to the teachings of one embodiment of the present invention.

Before describing in detail the particular diagnosis and repair system in accordance with one embodiment of the present invention, it should be observed that the present invention resides primarily in a novel combination of processing steps and hardware related to the diagnosis and repair of complex machines. Accordingly, these processing steps and hardware components have been represented by conventional processes and elements in the drawings, showing only those specific details that are pertinent to the present invention so as not to obscure the disclosure with structural details that will be readily apparent to those skilled in the art having the benefit of the description herein.

The block diagram of FIG. 1 shows the elements in accord with one embodiment of the present invention and also the interaction between them. A diagnosis and repair system 10 in FIG. 1, includes the following elements: a field engineer 12 with access to a machine 14, an on-line center 16, a repair center 18, and a design engineer represented by a block 20. Each of these elements will be discussed in detail below. Machine 14 (the machine to be diagnosed by the field engineer) may comprise an electrical machine, a mechanical machine, an optical machine, or a machine having a combination of electrical, mechanical, and/or optical aspects, for example.

The field engineer 12 has access to the machine 14, with responsibility to diagnose and repair the machine 14. The machine 14 and/or tool of field engineer 12 may include a subsystem for monitoring the machine's performance and maintaining an operational log. Many complex machines include an on-board subsystem that maintains a record of certain operational parameters (e.g., current demand, temperature, voltages) and some subsystems also identify anomalous conditions. In embodiments wherein such machines are adapted to communicate directly with an on-line center, the on-line center can analyze the information and provide the field engineer with instructions, for example, as to which tools and/or materials to bring for further analysis and/or repair. This is beneficial because field engineers can typically only carry a limited number of tools and/or materials to a machine site.

In addition to consulting the log, the field engineer 12 can discuss the nature of the fault and the operation of the machine 14 with machine users, and conduct a visual inspection of the machine. Relying on his field repair experiences with this and similar machines, plus the diagnostic information collected, the field engineer 12 attempts to diagnose the fault. As taught one embodiment of the present invention, the field engineer 12 also has access to expert systems which, in one embodiment are located at the on-line center 16, as an additional aid to the diagnosis process. For example, this access can be provided via a telnet session, an FTP file download, or an Internet web link. As is known to those skilled in the art, the field engineer 12 can access these Internet-based sites using a wireless or modem-based Internet-ready personal digital assistant, a laptop computer, etc.

On-line center 16 (which may be situated at the site of machine 14 or at a site remote from machine 14) may include an analysis tool for determining the probable cause of a fault. In one embodiment, the on-line center 16 accesses machine repair information created by the repair center 18. As machine repairs are undertaken at the repair center 18, an information repository is created for use in resolving subsequent faults for the same or similar machines. The information repository includes quality and reliability prediction information (e.g., fault trees and failure mode effects analysis) and an expert system knowledge base derived from the analysis of historical fault and repair data. Such a system can be especially helpful for new machines with which field engineers have not yet become familiar. For example, the reliability information can be used to identify the most likely predictive solutions for a given fault, and specific repairs to correct the fault. If a machine exhibited a particular failure mode, statistical information and/or confidence levels identifying the module components that were replaced is also maintained. For a statistical example, if 90 percent of the occurrences of a specific fault were corrected by replacing element A, 7 percent were corrected by replacing element B, and 3 percent of the faults were corrected by replacing element C, there is a very high likelihood that subsequent occurrences of this fault will likely be corrected by replacing element A. At least that should be the field engineer's first repair choice. According to the teachings of one embodiment of the present invention, the field engineer 12 has access to this statistical information and therefore can quickly and confidently replace element A, with a high likelihood that the fault will be corrected. If the repair solution solves the problem, then the statistical information and/or confidence levels can be dynamically updated. This database of fault resolution information is created at the repair center 18 and provided to the on-line center 16 via a communications link, such as an Internet web link. Once this information is transferred to the on-line center 16, it is accessible to the field engineer 12 as previously discussed.

The design engineer 20 also has access to the machine repair information stored at the on-line center 16. For example, the information can include statistics for each machine failure. Data such as the mean time between failures, the average number of failures in a given time interval, the relationship between failures and ambient conditions (for example, the ambient temperature), the most likely components to fail, and the symptoms exhibited by specific faults, can be valuable information for the design engineer 20. In the course of creating new machine designs or modifying existing machine designs, the design engineer 20 can use the machine repair information to conduct reliability studies, for yield prediction analyses, to select machine components, and to predict yield and reliability of new systems.

Figure 2:
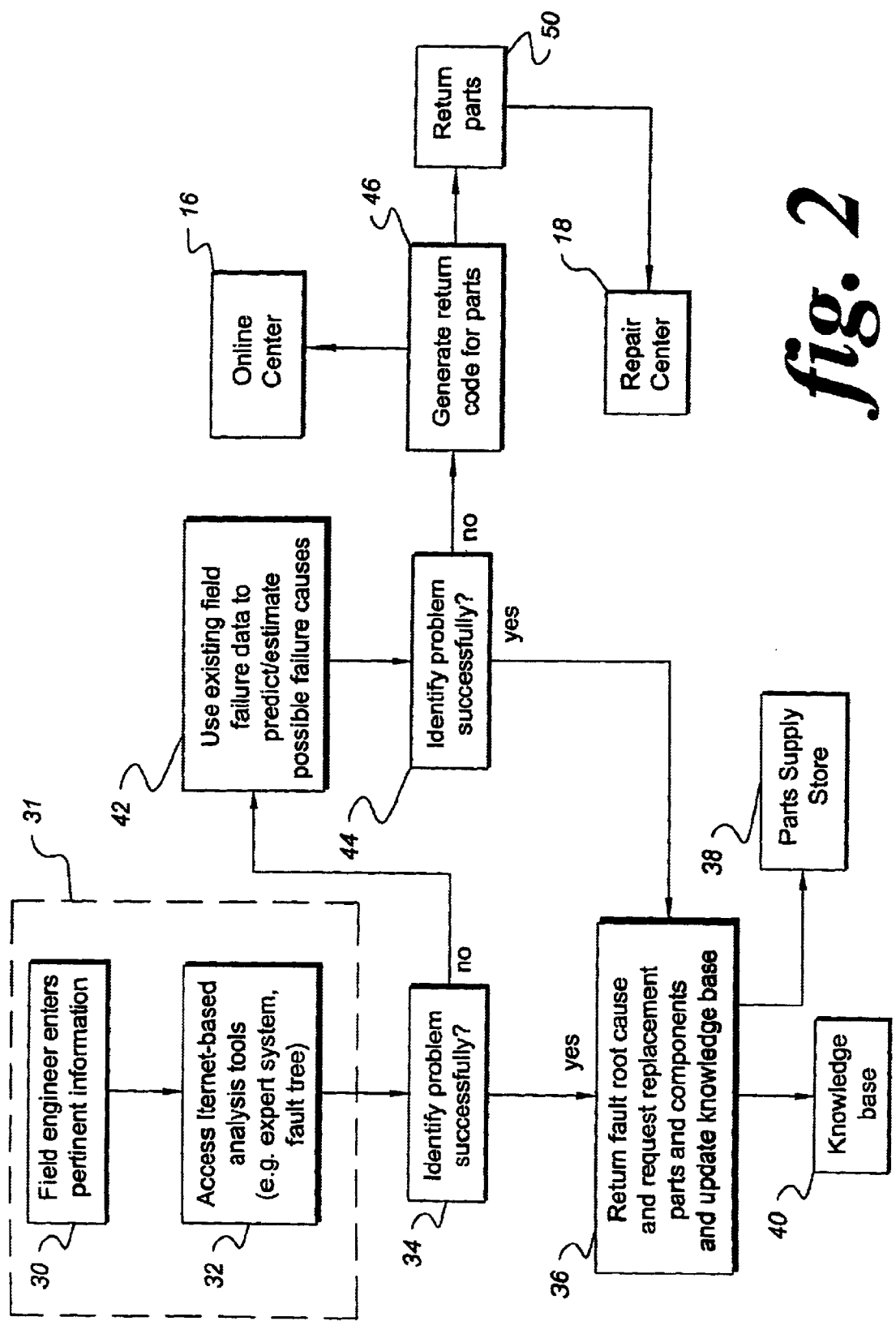
FIGS. 2, 3 and 4 are process flowcharts illustrating operation of the various system elements depicted in FIG. 1.

FIG. 2 illustrates an exemplary process utilized by the field engineer 12. The process begins at a step 30 where the field engineer 12 enters fault symptoms and any other desired information (such as date and time, for example) into a portable unit, such as a laptop computer or a personal digital assistant, and at a step 32, wherein the entered information is supplied to a web-based expert system for analyzing the field problem. In one embodiment, entry and analysis access steps 30 and 32 can be combined into one retrieval step 31 with field analysis queries, for example, as discussed below with respect to FIG. 4. This input is provided via the Internet as discussed in conjunction with FIG. 1. In one embodiment, the analysis process carried out at the step 32 is similar to a troubleshooting guide in an auto repair manual. As problem symptoms are entered, the expert system deduces the most likely root cause or causes of the problem. Then, as additional symptoms are identified the list of root causes narrows until the most likely root cause is identified. As is well known in the art, there are several tools and techniques available for identifying root causes, including case-based reasoning approaches and artificial intelligence techniques.

If the problem was successfully identified at the step 34, at a step 36 the fault root cause is automatically returned to the field engineer 12, and, if necessary, the necessary replacement parts or components are requested from the parts supply store 38. Also, a knowledge base 40 (which includes machine diagnostics solutions and at least one database such as a component defect database 41, for example) is automatically updated with the results of the fault resolution. For example, the knowledge base 40 may contain information as to the mean time between failure for the machine or its components. The reliability and accuracy of this information continues to increase as root cause problems are identified and added to the knowledge base 40 during the machine's life cycle. Data within the knowledge base 40 is also used to produce a reliability growth curve such as a Duane plot or Crow-AMSAA model, which are well known in the reliability art. The expert system, which is a part of the knowledge base 40, can also be upgraded as more machine experiences becomes available.

Returning to the step 34, if the problem was not successfully identified, the process moves to a step 42 where possible fault causes are identified using field machine failure data. The data consulted at the step 42 includes fault tree and failure mode effects analysis prepared during the design process, as augmented by the resolution of subsequent field failures to make the prediction/estimation process associated with the step 42 more accurate. The use of a fault tree or failure mode effects analysis is especially valuable during the early life cycle of the machine, as little actual fault data is available at that time. A decision step 44 asks whether the problem has been successfully identified. If the answer is affirmative, processing moves to the step 36 that was discussed above. If the problem has not been successfully resolved at the decision step 44, processing moves to a step 46 where a return code is automatically generated by the on-line center 16. To this point, the search path or diagnostic procedure performed by the field engineer 12 has been saved for later use at the repair center as discussed below. Because the field engineer's diagnostic steps are retained, she is no longer required to write a detailed account of the diagnostic steps undertaken before the malfunctioning machine or machine part is returned to the repair center. Generally, this is a laborious and time consuming task for the field engineer. The faulty machine or machine part is then returned to the repair center 18 at a step 50. At the repair center, more sophisticated diagnostic tools and software, which are not available to the field engineer 12, are used to diagnose and then repair the machine. The return code is associated with the fault symptoms entered by the field engineer 12 and the search or diagnostic path performed by the field engineer 12, which will help reduce the diagnosis and repair effort at the repair center 18. The repair center process is discussed below in conjunction with FIG. 3.

Figure 3:
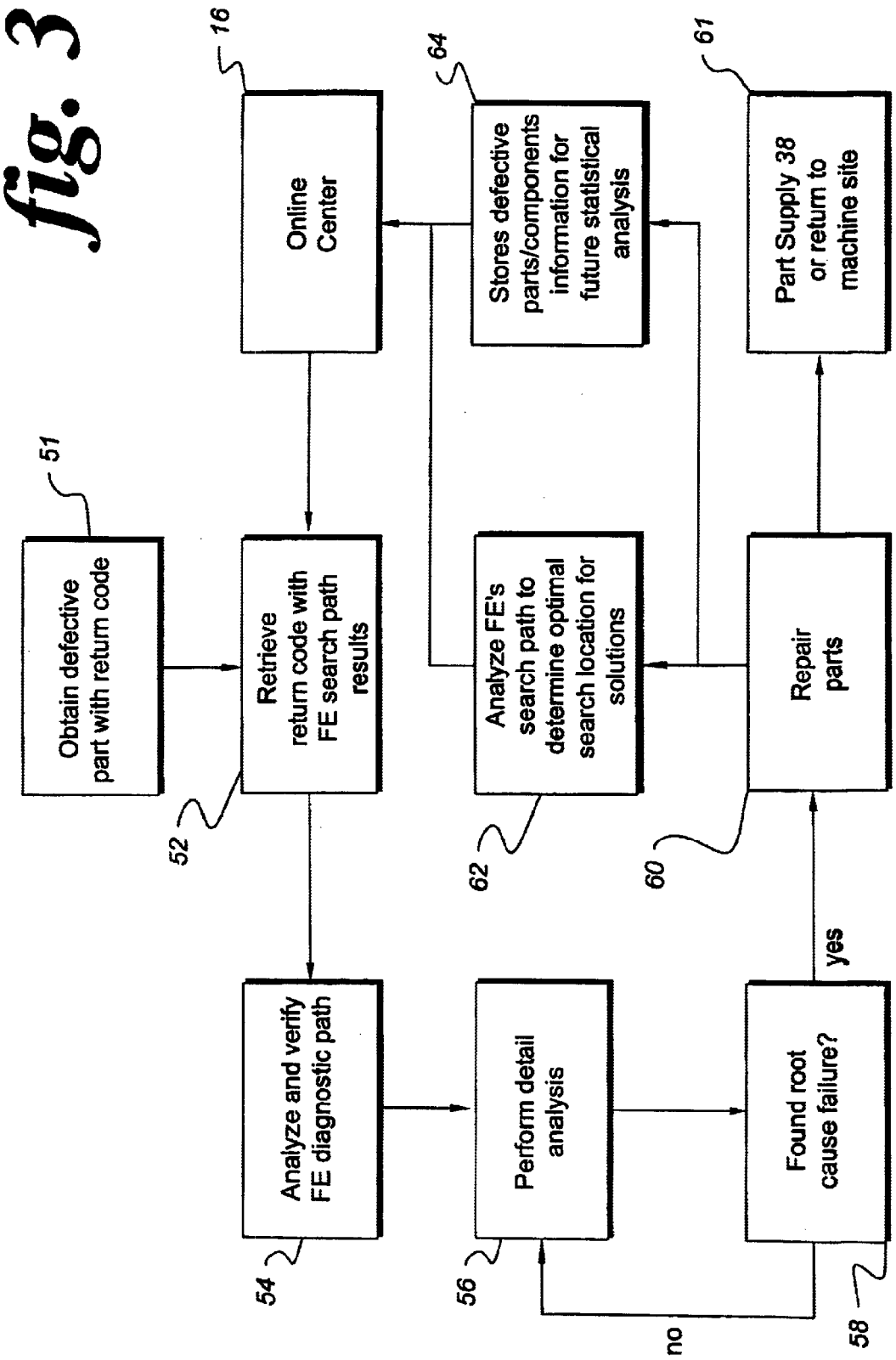

FIG. 3 illustrates an exemplary repair process undertaken at the repair center 18. The field engineer 12 has been unable to diagnose the failure, has returned at least a part of the machine to the repair center 18, and has obtained a return code as discussed in conjunction with FIG. 2. At the repair center 18, a repair technician obtains the defective part to which a return code has been assigned, as shown at a step 51. At a step 52, the repair technician retrieves the return code, which is associated with the fault symptoms entered by the field engineer 12 as well as the diagnostic or search path. The repair technician can analyze and verify the search path executed by the field engineer 12 (see a step 54) and use the search path in the subsequent fault analysis. Using the repair tools available at the repair center, a detailed analysis is performed on the defect, as shown at a step 56. That analysis continues until the root cause of the failure is determined, as represented by a decision step 58. If it has not, processing continues back to the step 56 where additional analysis is conducted. If the root cause has been detected, processing moves to a step 60 where the part or machine is repaired. The repaired part or machine is then moved to the supply store 38 or returned to the machine site for later use, as illustrated at a step 61. Following the repair step 60, an analysis is undertaken of the field engineer's search path to determine how and where that search path can be augmented to include information related to the current fault and its root cause. In an exemplary embodiment, the expert system, and the case-based reasoning and artificial intelligence tools referred to above, which drive the field engineer's diagnosis search path, are modified so that subsequent identical or related machine problems will more quickly converge to the correct fault diagnosis, without intervention from the repair center 18. This process of updating the field engineer's search path is illustrated by a step 62 in FIG. 3. These revisions are stored at the on-line center 16.

Also following the repair step 60, information describing the defects in the parts/components is stored at the on-line center 16 for updating the fault statistics for later use by machine design engineers and field engineers. This process is illustrated at a step 64.

Figure 4:
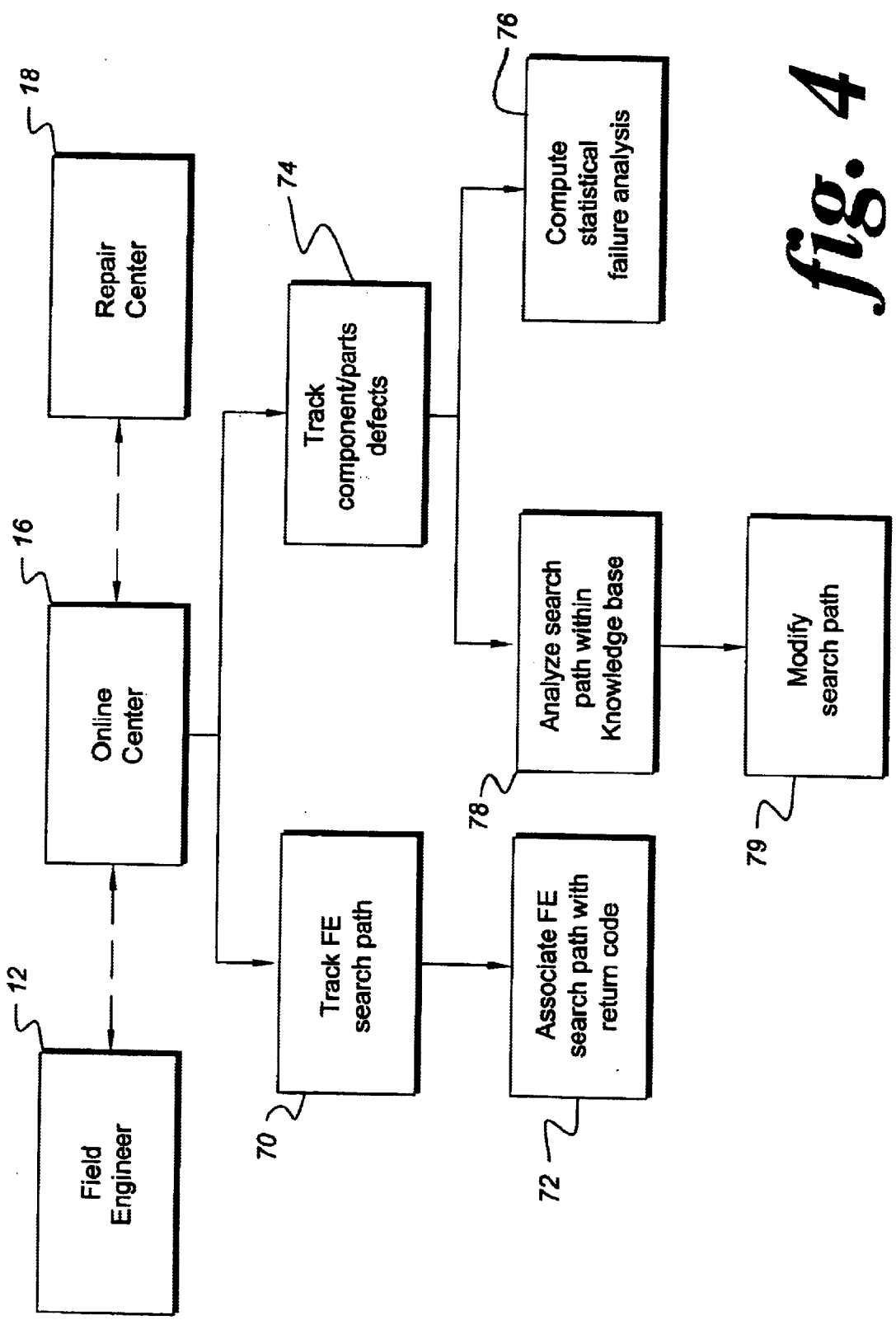

FIG. 4 depicts an exemplary process operative at the on-line center 16. As discussed in conjunction with FIGS. 2 and 3, information is sent to the on-line center 16 by the field engineer 12 and by the repair center 18. The on-line center 16 tracks the search path undertaken by the field engineer 12, as represented by a step 70. This search path includes the expert systems or other fault prediction tools available at the on-line center for use by field engineers. At a step 72, the search path is associated with a return code, for later retrieval at the repair center 18, as discussed above. At a step 74, the on-line center 16 tracks individual components and parts and the defects experienced. Statistical failure analysis can be performed (see a step 76) to improve the reliability of the statistical fault database.

In one embodiment, the analysis tool of the on-line center obtains fault symptoms and any other appropriate information by querying the field engineer. In this embodiment, the search path then includes both the queries and the field engineer responses. At a step 78, the search path may be analyzed so that it too can be modified (see a step 79) with information concerning the present fault and its resolution.

The present invention thus includes a variety of embodiment options to overcome the disadvantages discussed above in the Background. Allowing the field engineer real time access to general and machine specific technical and design documentation heretofore not available at the field site is useful to assist the field engineer with the diagnosis and repair. Also, the diagnostic steps executed by the field engineer can be automatically tracked and maintained for later analysis at the repair center in the event the field engineer is unable to correct the fault and therefore must send the malfunctioning part to the repair center. The result is reduction in machine down time experienced by the customer. Even if the machine requires repair at the repair center, personnel at the repair center can more quickly conduct the repair by utilizing the diagnostic approach undertaken by the field engineer as a starting point. Field repair data can be stored in an information repository for later use by design engineers so that the quality and reliability of the machine can be improved. Further, the present invention can be used for dynamically updating the information repository with machine design changes and their implementation date so that the field engineer has immediate access to the most current machine information, making the diagnosis process easier and reducing the likelihood of unnecessary and futile repairs.

While the invention has been described with reference to a preferred embodiment, it will be understood by those skilled in the art that various changes may be made and equivalent elements may be substituted for elements and steps thereof without departing from the scope of the invention. In addition, modifications may be made to adapt a particular situation more material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for use by a field engineer for analyzing a fault condition on a machine located at a machine site, comprising:

at the machine site, providing information to an analysis tool for the analyzing the fault, wherein the information is provided by the field engineer as queried by the analysis tool, and wherein a plurality of individual queries and field engineer responses constitute a search path;

if the analysis tool determines the probable cause of the fault, repairing the machine at the machine site based thereon;

if the analysis is tool unable to determine the probable cause of the fault, assigning a return code, transmitting the search path and the return code to a repair center, and moving at least a part of the machine to the repair center;

analyzing the search path; and using the search path analysis to modify the analysis tool to improve the probability that future use of the analysis tool will converge to the correct fault solution.

2. The method of claim 1 wherein the analysis tool attempts to determine a probable cause of the fault by using an expert system for receiving fault symptoms and for providing a fault root cause.

3. The method of claim 1 where the analysis tool attempts to determine a probable cause of the fault by using a fault free associating a plurality root causes with a probability measure that a root cause will resolve the fault.

4. The method of claim 1 further comprising, at the repair center:

performing a detailed analysis of the at least a part of the machine to identify the root cause using information available in the search path; and repairing the at least a part of the machine.

5. The method of claim 1 wherein the analysis tool is located at a site remote from the machine.

6. A method for use by a field engineer for analyzing a fault condition on a machine located at a machine site, comprising;

at the machine site, providing information to an analysis tool for analyzing the fault, wherein the information is provided by the field engineer as queried by the analysis tool, and wherein a plurality of individual queries and field engineer responses constitute a search path;

if the analysis tool determines the probable cause of the fault, repairing the machine at the machine site based thereon;

if the analysis tool is unable to determine the probable cause of the fault, assigning a return code, transmitting the search path and the return code to a repair center, and moving at least a part of the machine to repair center; and computing statistical failure analysis data based on the fault.

7. A system for analyzing a fault condition on a machine, comprising:

an on-line center for receiving fault symptoms for a field engineer at a machine site, for analyzing the fault symptoms using an analysis tool, for returning probable fault cause information if obtainable, and for assigning a return code associated with the fault symptoms if fault cause information is not obtainable, wherein the on-line center is adapted to generate queries to receive the fault symptoms and where a plurality of queries and respective responses constitute a search path;

a repair center for, if fault cause information is not obtainable, receiving at least a part of the machine, the return code, and the search path and using the return code and the search path for further analysis; wherein the analysis tool is adapted to analyze the search path and use the search path analysis to modify the analysis tool to improve the probability that future use of the analysis tool will converge to correct fault solution.

8. The system of claim 7 wherein the on-line center includes an expert system for receiving fault symptoms and for providing probable fault cause information.

9. The system of claim 7 wherein the on-line center includes a fault tree associating a plurality of fault root causes with a probability measure that a specified cause will resolve the fault.

10. The system of claim 7 wherein the on-line center is augmented with information concerning the fault and a root cause thereof after the further fault analysis.

11. The system of claim 7 wherein the on-line center is adapted to use an analysis of the search path to improve future query generations.

12. A system for analyzing a fault condition on a machine, comprising;

an on-line center for receiving fault symptoms from a field engineer at a machine site, for analyzing the fault symptoms using an analysis tool, for returning probable fault cause information if obtainable, and for assigning a return code associated with the fault symptoms if fault cause information is not obtainable, wherein the on-line center is adapted to generate queries to receive the fault symptoms and wherein a plurality of queries and respective responses constitute a search path;

a repair center for, if fault cause information is not obtainable, receiving at least a part of the machine, the return code, and the search path and using the return code and the search path for further fault analysis; wherein the analysis tool is adapted to compute statistical failure analysis data based on the fault.

13. A system for use by a field engineer for analyzing a fault condition on a machine located at a machine site, comprising:

at the machine site, means for identifying fault symptoms at the machine site;

means for automatically providing a fault analysis of the fault analysis of the fault symptoms including a probable cause of the fault from the fault symptoms, wherein the fault providing analysis means are adapted to generate queries to receive the fault symptoms and wherein a plurality of queries and respective responses constitute a search path;

means for, when the fault analysis providing means are successful, automatically providing machine site repair instructions;

means for, when the fault analysis providing means are not successful assigning a return code and transmitting the search path and the return code to a repair center;

wherein the fault providing analysis means are further adapted to analyze the search path and use the search path analysis to modify the analysis tool to improve the probability that the future use of the analysis tool will converge to the correct fault solution.

14. The system of claim 13 where the fault analysis providing means a situated remotely from the machine sit.

15. The system of claim 13 where the fault analysis providing means is adapted to use an analysis of the search path to improve future query generations.

16. A system for use by a field engineer for analyzing a fault condition on a machine located at a machine site, comprising:

at the machine site, means for identifying fault symptoms at the machine site;

means for automatically providing a fault analysis of the fault symptoms including a probable cause of the fault from the fault symptoms, wherein the fault providing analysis means are adapted to generate queries to receive the fault symptoms and wherein a plurality of queries and respective responses constitute a search path;

means for, when the fault analysis providing means are successful, automatically providing machine site repair instructions;

means for, when the fault analysis providing means are not successful assigning a return code and transmitting the search path and the return code to a repair center; wherein the fault providing analysis means are adapted to compute statistical failure analysis data based on the fault.

* * * * *